US006066987A

United States Patent [19]
Lorenz

[11] Patent Number: 6,066,987
[45] Date of Patent: May 23, 2000

[54] DIFFERENTIAL CASCODE MAGNETO-RESISTANCE PREAMPLIFIER WITH BIAS BYPASS

[75] Inventor: Perry Lorenz, Sunnyvale, Calif.

[73] Assignee: National Semiconductor Corp., Santa Clara, Calif.

[21] Appl. No.: 09/039,285

[22] Filed: Mar. 12, 1998

[51] Int. Cl.[7] ..................................................... H03G 3/30
[52] U.S. Cl. ......................... 330/311; 330/252; 330/261; 330/296; 330/310
[58] Field of Search ................................ 330/252, 261, 330/296, 310, 311

[56] References Cited

U.S. PATENT DOCUMENTS 4,621,238  11/1986  Fenk .......................................... 330/261
4,728,902   3/1988  Gleason et al. ........................... 330/261

*Primary Examiner*—Michael B Shingleton
*Attorney, Agent, or Firm*—Skjerven Morrill MacPherson Franklin & Friel LLP; Edward C. Kwok

[57] ABSTRACT

A high-gain, high-bandwidth, low-noise differential common-emitter-common-base cascode preamplifier for use in the read circuitry of an MR head system includes a by-pass circuitry. Currents generated in load devices connected to the preamplifier are added to currents generated in the by-pass circuitry to provide the currents that flow through the common-emitter transistors of the preamplifier.

24 Claims, 6 Drawing Sheets

DIFFERENTIAL CASCODE MAGNETO-RESISTANCE PREAMPLIFIER WITH BIAS BYPASS

FIELD OF THE INVENTION

The present invention relates to a cascode preamplifier, and more specifically, to a low-noise, high-gain cascode preamplifier for use in a magnetic storage device.

DESCRIPTION OF THE RELATED ART

Magnetic storage systems store information by magnetizing bit positions on tracks located on a surface of a magnetic media, e.g. a magnetic disk. An actuator arm supports and maintains a Magneto-Resistive (MR) head close to the magnetic disk surface to perform the read and write operations on the disk surface. As the magnetic disk is moved past the MR head, the variations in the magnetic flux passing through the MR head result in changes in the electrical resistance of the MR head.

An MR head is often biased with a constant electrical current which generates a voltage across the MR head. A preamplifier is then used to detect changes in the voltage across the MR head which are caused by the variations in the electrical resistance of the MR head. Changes in the voltage across the MR head are then used to extract the data stored on the magnetic disk surface.

FIG. 1 illustrates a schematic diagram of a cascode preamplifier 10, used in the read circuitry of an MR head system, as known in the prior art, and incorporated herein by reference only. The gain of preamplifier 10 is determined in part by dividing the resistance of resistor 12 by the internal emitter resistance of transistor 16, which is inversely proportional to the current flowing through transistor 16. Consequently, to achieve a high gain, both the resistance of resistor 12 as well as the current through transistor 16 of branch 205 must be made relatively large.

However, by increasing either the resistance of resistor 12 or the current through transistor 16, the voltage at output node N25 falls. When the voltage at node N25 falls below a threshold limit, the base-to-collector junction of transistor 13 becomes forward biased, forcing transistor 13 into a saturation region of operation; a condition which must be avoided at all times.

Preamplifier 10 operates on a differential basis. Therefore, the same discussion made above with respect to branch 205 which is composed of resistor 12 and transistors 13 and 16, equally applies to branch 210 which is composed of resistor 14 and transistors 11 and 18. Consequently, when the resistance of resistor 14 or the current through transistor 11 is increased beyond a certain threshold limit, transistor 11 enters a saturation region.

Therefore, preamplifier 10 is inherently limited in providing a high gain. The limited gain subjects preamplifier 10 to a high level of noise. The inherently low gain and the high susceptibility to noise renders preamplifier 10 ineffective for use in a magnetic storage device.

SUMMARY

In accordance with the present invention, a preamplifier for use in the read circuitry of an MR head system has a high gain. The preamplifier includes a differential common-emitter-common-base cascode configuration in which the currents flowing through the load devices are smaller in magnitude than those flowing through the common-emitter transistors. The configuration, therefore, provides a high preamplifier gain while maintaining the common-base transistors in forward active regions.

The cascode preamplifier, in accordance with the present invention, has a high gain, a high bandwidth and low noise.

DETAILED DESCRIPTION

Figure 1:
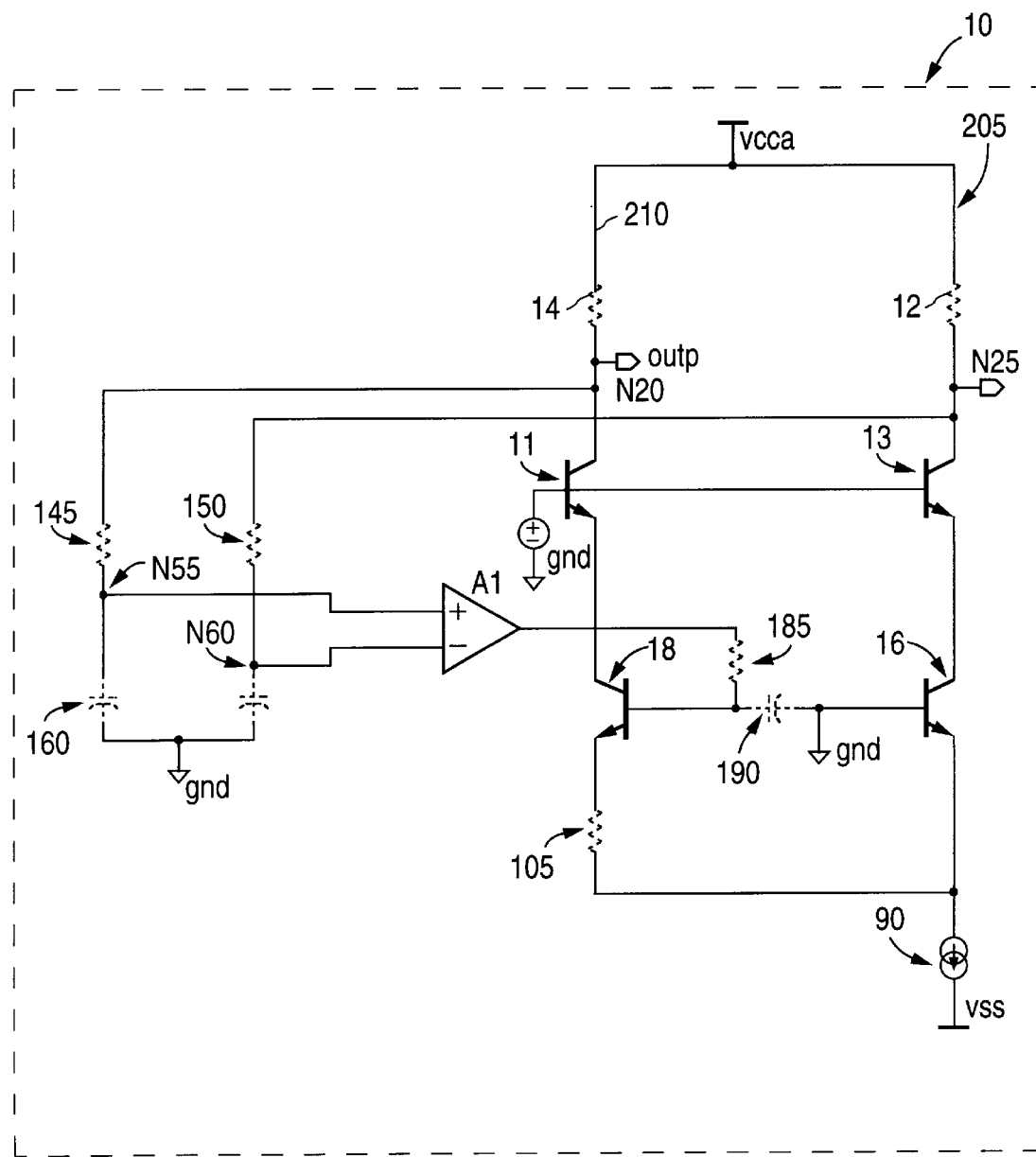
FIG. 1 illustrates a schematic diagram of a cascode preamplifier, used in the read circuitry of an MR head system, as known in the prior art.
Figure 2:
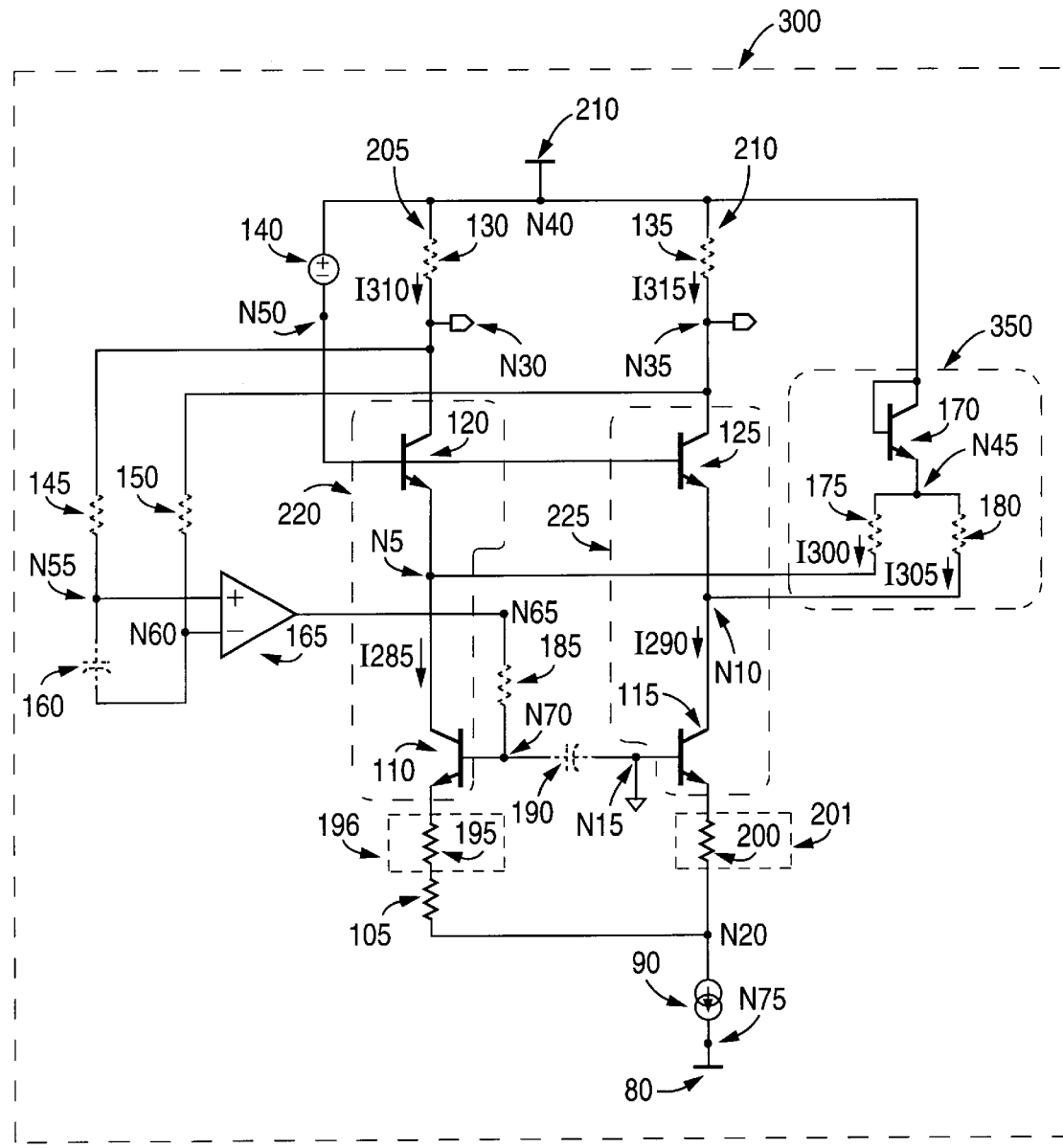
FIG. 2 illustrates a schematic diagram of a cascode preamplifier, used in the read circuitry of an MR head system, in accordance with the present invention.

A differential common-emitter-common-base cascode preamplifier 300 for use in the preamplification stage of a read circuitry of an MR head system, in accordance with the present invention, is shown in FIG. 2.

Resistor 105, representing the resistance of the MR head, is connected across the emitter terminals of transistors 110 and 115. Resistors 195 and 200, shown in FIG. 2 inside perimeter lines 196 and 201, are the internal emitter resistances, known in the art as $r_e$, of transistors 110 and 115, respectively, and are shown for the purpose of analysis only. Transistors 110 and 120, configured as a common-emitter and a common-base transistor amplifiers, respectively, together form cascode configuration 220 of a first branch 205 of preamplifier 300. Transistors 115 and 125 configured as a common-emitter and a common-base transistor amplifiers, respectively, together form cascode configuration 225 of a second branch 210 of preamplifier 300.

The collector terminals of transistors 120 and 125, forming the output nodes of cascode amplifiers 220 and 225, are connected to nodes N30 and N35, respectively. The base terminals of transistors 120 and 125 are connected to node N50. The emitter terminals of transistors 120 and 125 are connected to nodes N5 and N10, respectively. Load resistor 130 is connected across nodes N30 and N40, and load resistor 135 is connected across nodes N35 and N40. Voltage supply 210 is applied to node N40. Resistor 175 is connected across nodes N45 and N5, and resistor 180 is connected across nodes N45 and N10. The emitter terminal of diode-connected transistor 170 is connected to node N45. The collector and the base terminals of transistor 170 are connected to node N40. The positive and the negative terminals of voltage supply 140 are connected to nodes N40 and N50, respectively. The positive and the negative terminals of current source 90 are connected to nodes N20 and N75, respectively. Voltage supply 80 is applied to node N75. Resistor 145 is connected across nodes N30 and N55, and resistor 150 is connected across nodes N35 and N60. Capacitor 160 is connected across nodes N55 and N60. Nodes N55 and N60 are connected to the positive and the negative input terminals of amplifier 165, respectively. The output terminal of amplifier 165 is connected to node N65. Resistor 185 is connected across nodes N65 and N70, and capacitor 190 is connected across nodes N70 and N15. The base terminals of transistors 110 and 155 are connected to nodes N70 and N15, respectively. Currents I310 and I315 flow through branches 205 and 210, respectively.

A high gain for preamplifier 300 requires that the resistance of resistor 135 and 130 be substantially larger than the internal emitter resistances 200 and 195, respectively.

To keep transistors 120 and 125 in forward active regions while selecting in resistors 130 and 135 relatively large resistance values, currents I310 and I315 are required to have relatively small magnitudes.

Preamplifier 300 is DC-balanced, therefore the DC components of currents I310 and I315 have an equal magnitude. Similarly, the DC components of currents I300 and I305, flowing through resistors 175 and 180, respectively, have an equal magnitude. Because the magnitude of current I285 is equal to the sum of the magnitudes of currents I300 and I310, and the magnitude of current I290 is equal to the sum of the magnitudes of currents I315 and I305, the DC components of currents I285 and I290 flowing through transistors 110 and 115 have an equal magnitude as well.

The resistances of resistors 195 and 200 are inversely proportional to the magnitudes of currents I285 and I290, respectively. To increase the magnitudes of currents I285 and I290 in order to achieve low resistances for resistors 195 and 200, the magnitudes of currents I300 and I305 are made relatively large, allowing the magnitudes of currents I310 and I315 to remain relatively small.

Current by-pass circuitry 350 furnishes a large preamplifier 300 gain for two reasons. First, by-pass circuitry 350, by supplying current components I300 and I305, maintains a relatively large current flow through transistors 110 and 115, thereby making the resistances of the internal emitter resistors 195 and 200 proportionately small. Second, by-pass circuitry 350 dispenses with the need for large magnitudes of 15 currents I310 and I315 to flow through resistors 130 and 135, thereby allowing resistors 130 and 135 to have large resistances. The high resistances of resistors 130 and 135, in conjunction with the low emitter resistances of resistors 195 and 200, generate a high gain for preamplifier 300. At the same time, low magnitudes of currents I310 and I315 maintain the voltages at nodes N30 and N35 at sufficiently high levels to keep transistors 120 and 125 in forward active regions.

The high gain also improves the overall noise susceptibility of preamplifier 300 by diminishing the collector shot-noise.

In some embodiments of the present invention, bipolar transistors 110 and 115 are made relatively large for the purpose of lowering their base resistances in order to minimize the noise generated in their respective base regions.

In some embodiments of the present invention, the magnitudes of currents I300 and I305, as well as the resistances of resistors 175 and 180 are selected such that the DC voltage across nodes N45 and N5 as well as the DC voltage across nodes N45 and N10 are equal in magnitude to the voltage across voltage supply 140. Transistor 170 performs voltage tracking so that the DC voltage across nodes N45 and N5, as well as the DC voltage across nodes N45 and N10 of by-pass circuitry 350 remains close to that across voltage supply 140.

To maintain the DC balance in preamplifier 300, amplifier 165 senses, at its input terminals, voltage signals representative of preamplifier 300 output voltage signals and feeds back from its output terminal a voltage signal that is applied to a first end of resistor 185. A second end of resistor 185 is connected to the base terminal of transistor 110. Capacitor 190 is used for coupling the base voltages of transistors 110 and 115. Resistors 145 and 150, in conjunction with capacitor 160, filter out the AC components of the voltage signals that are applied to the input terminals of amplifier 165.

In some embodiments of the present invention, voltage supplies 210, 140 and 80 provide five volts, 3 volts and negative five volts, respectively. Resistances of resistors 130 and 135 are 800 ohms each, and the magnitude of the current flowing through current source go is 10 milliamps. The magnitude of currents I285 and I290 flowing through transistors 110 and 115, respectively, is 5 milliamps, resulting in a resistance of 5 ohms for each of the emitter resistors 195 and 200. The magnitude of the current flowing through transistor 170 is 6 milliamps, with 3 milliamps of current flowing through each one of resistors 175 and 180. Advantageously, currents I310 and I315 flowing through branches 205 and 210, each have a magnitude of 2 milliamps. Assuming that the MR head has a resistance of 25 ohms, the total resistance as seen by the emitter terminal of transistor 115 is 30 ohms. The above configuration yields a preamplifier 300 gain of 26.7, which is computed by dividing the resistance of resistor 135, which has a value of 800 ohms, by the sum of the resistances of resistors 200 and 105; a sum which is 30 ohms. Advantageously, the voltages across the collector-emitter terminals of transistors 120 and 125 are approximately 1.9 volts, keeping both transistors 120 and 125 in forward active regions.

Preamplifier 300 provides a high gain and maintains transistors 120 and 125 in active regions, in spite of the variations in the MR head type. Depending on the MR head type used, the read circuitry of an MR head system may require a different magnitude of biasing current to flow through current source 90. Variations from 5 milliamps to 14 milliamps in the magnitude of biasing current 90 are not uncommon. Preamplifier 300 advantageously provides the needed gain in spite of the variations in the magnitude of biasing current 90.

Figure 3:
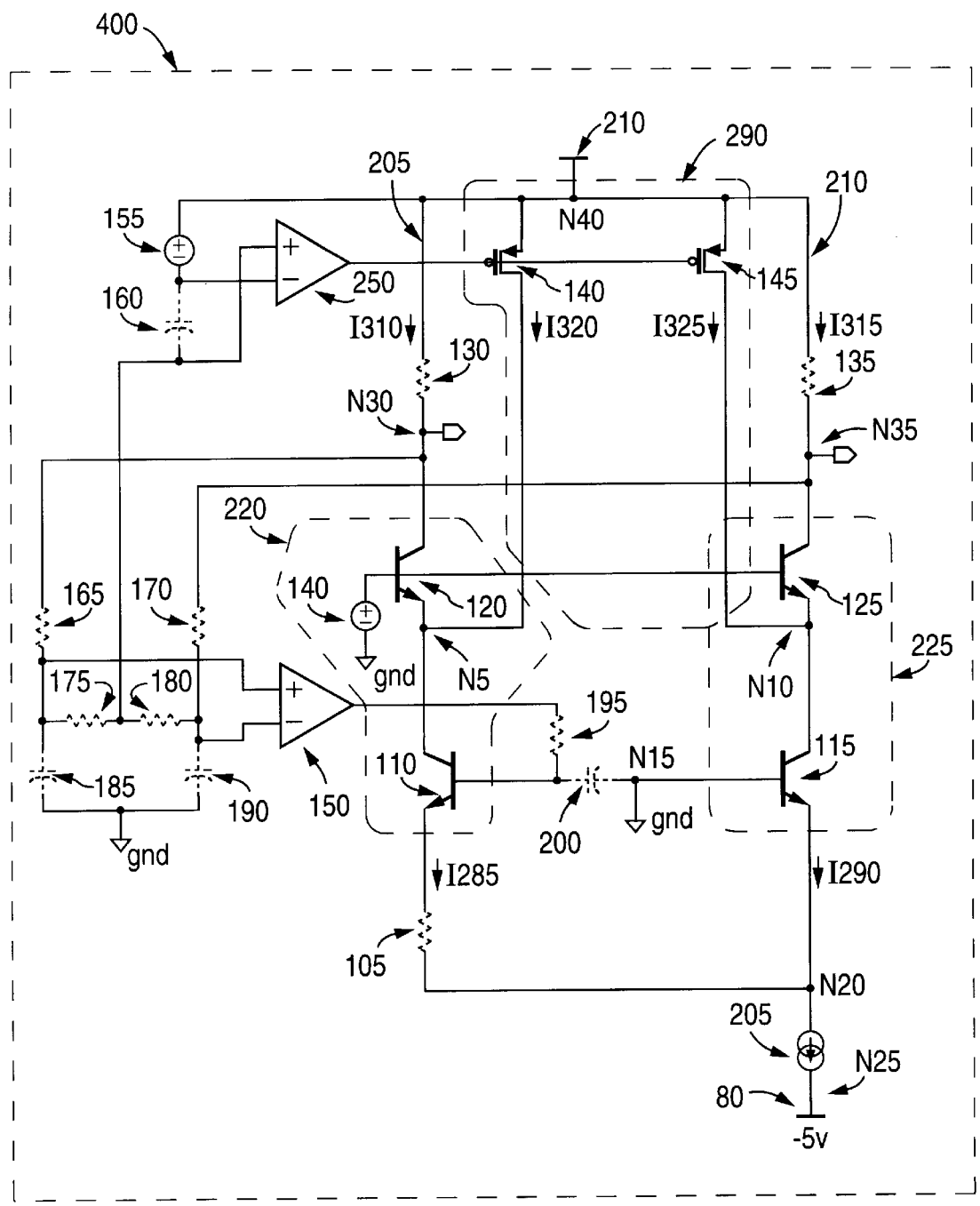
FIG. 3 illustrates an alternative schematic diagram of a cascode preamplifier, used in the read circuitry of an MR head system, in accordance with the present invention.

FIG. 3 shows the schematic diagram of another embodiment 400 of the present invention. In embodiment 400, by-pass circuitry 290 includes two p-channel MOS transistors 140 and 145. The source terminals of both transistors 140 and 145 are connected to node N40. Voltage supply 210 is applied to node N40. The drain terminals of transistors 140 and 145 are connected to the emitter terminals of transistors 120 and 125, respectively. Amplifier 250 senses, at its positive input terminal, a voltage signal proportional to the average of preamplifier 400 output voltage signals and generates an output voltage that is applied to the gate terminals of p-channel MOS transistors 140 and 145.

By-pass circuitry 290 achieves the dual goal of maintaining a relatively large gain in preamplifier 400 while simultaneously keeping transistors 120 and 125 in forward active regions by dispensing with the need to require currents I320 and I325 to flow through resistors 130 and 135, respectively. Currents I310 and I315 are added to currents I320 and I325, respectively, to produce currents I285 and I290, respectively. Noise contribution introduced by transistors 140 and 145 is significantly attenuated by the emitter resistances of transistors 120 and 125, respectively.

Figure 4:
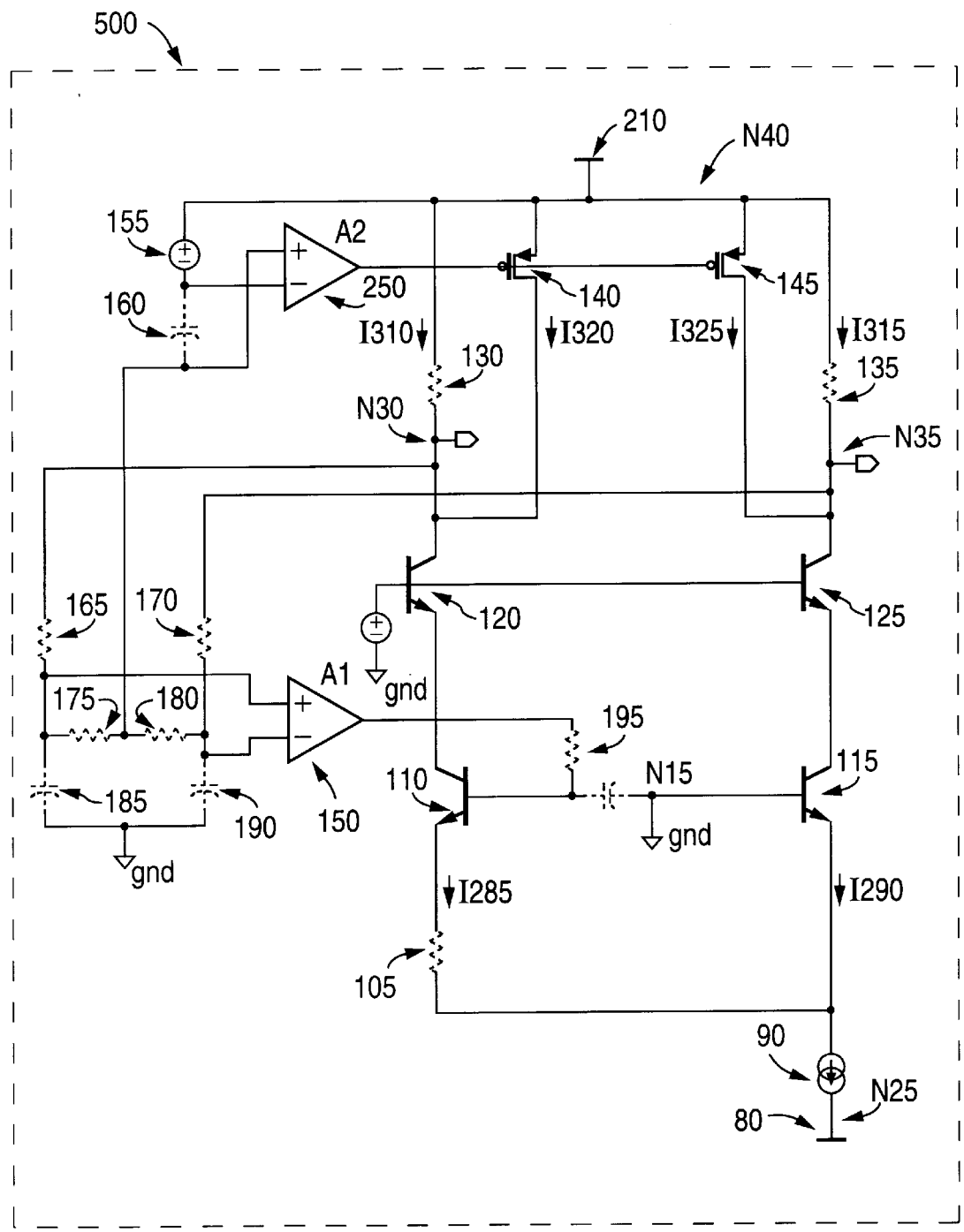
FIG. 4 illustrates another alternative schematic diagram of a cascode preamplifier, used in the read circuitry of an MR head system, in accordance with the present invention.

FIG. 4 shows the schematic diagram of another embodiment 500 of the present invention. Embodiment 500 is similar to embodiment 400 shown in FIG. 3 except that the drain terminals of by-pass transistors 140 and 145 are connected to the collector terminals of transistors 120 and 125, respectively.

Figure 5:
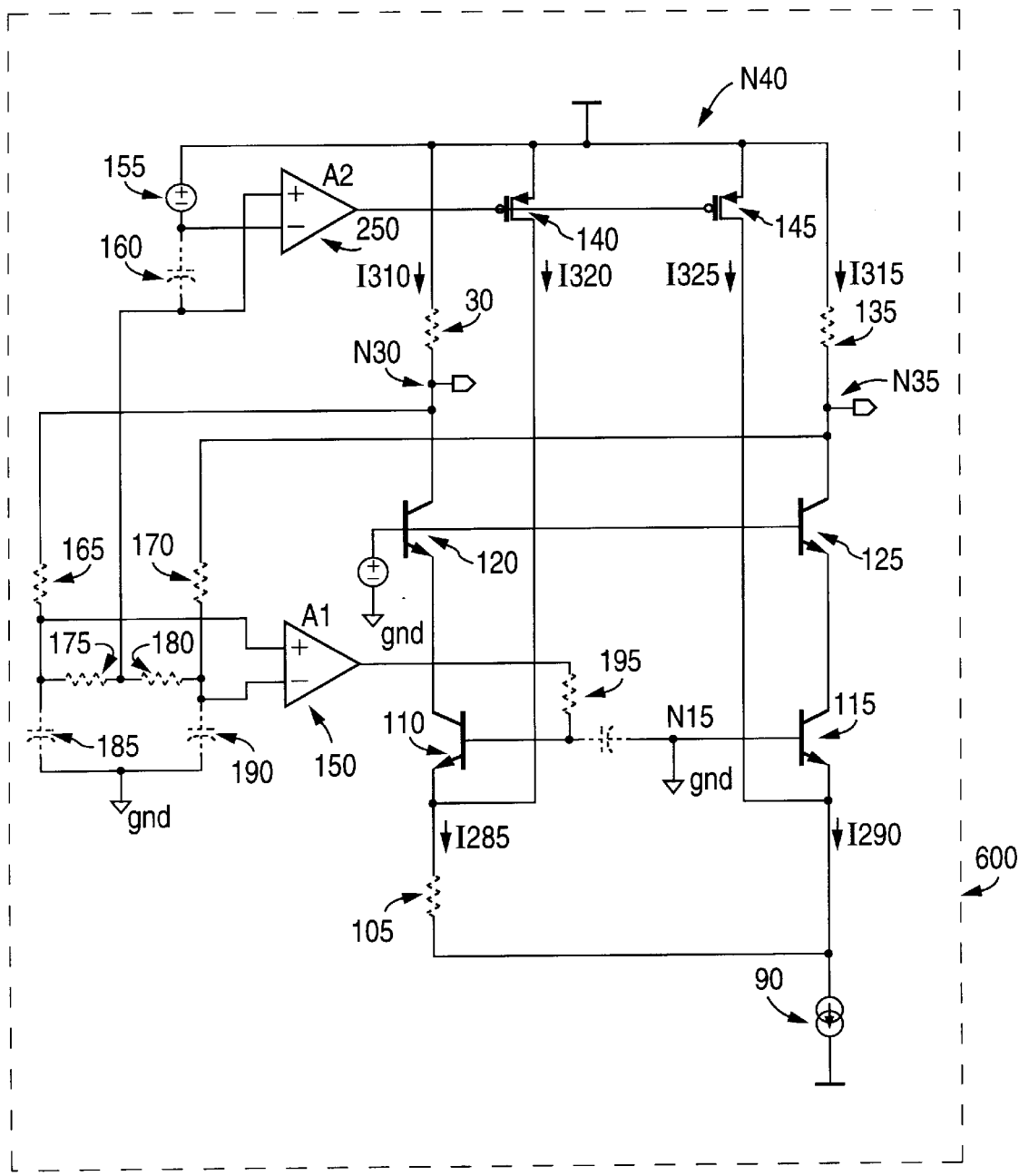
FIG. 5 illustrates another alternative schematic diagram of a cascode preamplifier, used in the read circuitry of an MR head system, in accordance with the present invention.

FIG. 5 shows the schematic diagram of another embodiment 600 of the present invention. Embodiment 600 is similar to embodiment 400 shown in FIG. 3 except that the drain terminals of by-pass transistors 140 and 145 are connected to the emitter terminals of transistors 110 and 115, respectively. Embodiment 600 is used only when the MR head requires more current than is optimum for the low noise operation of the amplifier.

Figure 6:
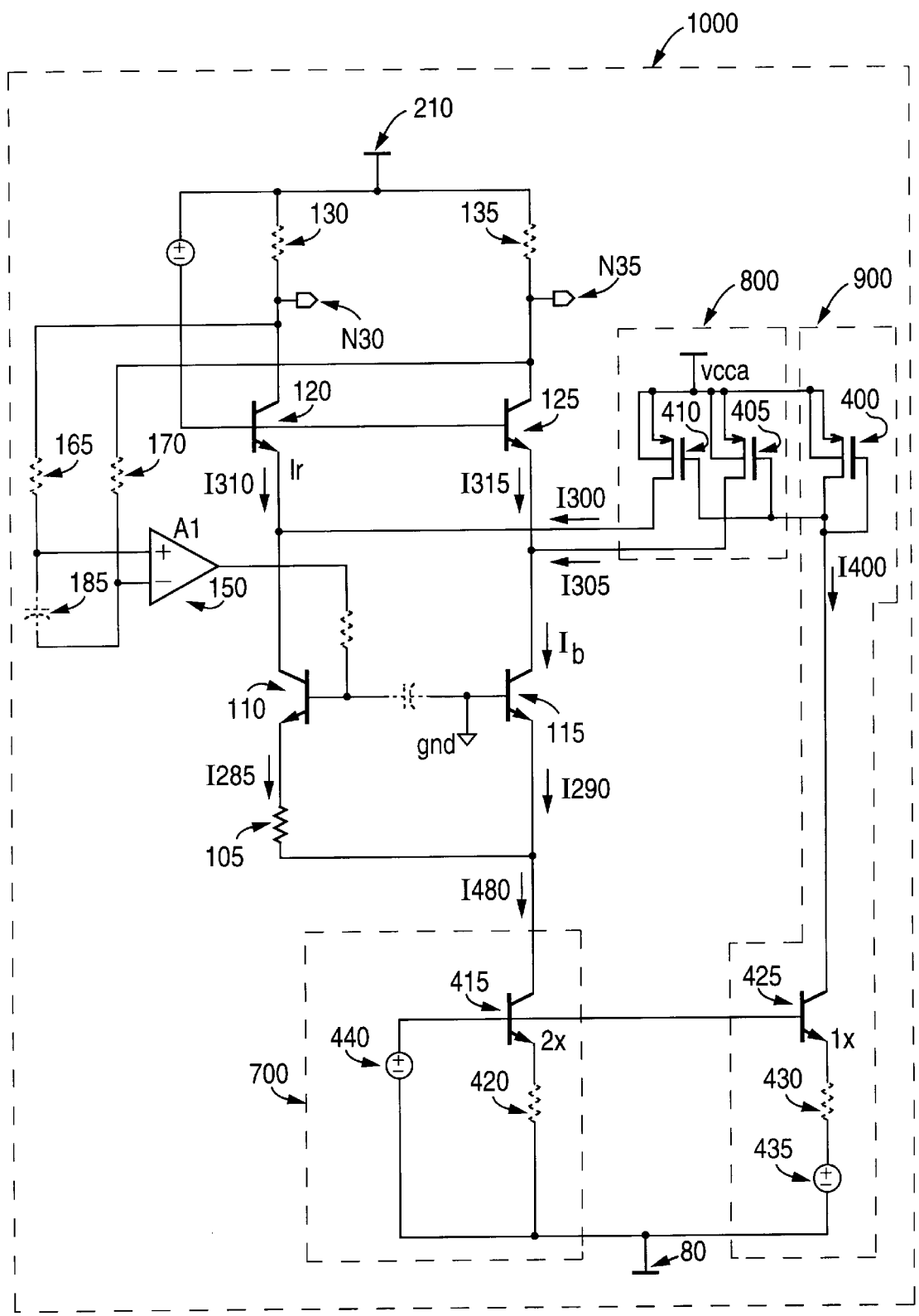
FIG. 6 illustrates another alternative schematic diagram of a cascode preamplifier, used in the read circuitry of an MR head system, in accordance with the present invention.

FIG. 6 shows the schematic diagram of embodiment 1000 of the present invention. Biasing circuit 700 establishes the DC biasing level in preamplifier 1000. Current source 900 biases by-pass circuitry 800. Current source 900 produces current I400 which is substantially mirrored in P-channel MOS transistors 405 and 410 of by-pass circuitry 800. Preamplifier 1000 is DC-balanced, therefore, the DC components of currents I310 and I315 have an equal magnitude. Similarly, the DC components of currents I300 and I305 have an equal magnitude. Therefore, the DC components of currents I285 and I290, flowing through transistors 110 and 115, respectively, have an equal magnitude as well.

Assuming that the magnitudes of currents I310 and I315 are equal to the term Ir, and that the magnitudes of currents I300 and I305 are equal to the term Ib–Ir, then the magnitude of current I480 flowing through transistor 415 is equal to twice the value of the term Ib. Because transistors 400, 405 and 410 have similar gate-to-source voltages, the magnitude of the current flowing through transistors 400 is also equal to the term Ib–Ir.

Given the above, the difference between the magnitudes of currents I480 and I400 that flow through the collector terminals of transistors 415 and 425, respectively, is equal to:

Ib+Ir

Because bipolar transistors 415 and 425 have the same base voltages, proper selection of transistor sizes for transistors 415 and 425 and resistance values for resistors 420 and 430 and proper selection of supply voltage in supply voltage source 440 must be made to accommodate for the difference in the magnitudes of the collector currents of transistors 415 and 425.

To provide the current difference Ib, two design choices are made. First, transistor 415 is selected to have an emitter area which is twice the size of that of transistor 425, giving transistor 415 a current generation capability that is twice that of transistor 425 for the same base-to-emitter voltages. Second, resistor 430 is selected to have a resistance which is twice that of resistor 420. The difference between the sizes of the emitter areas of transistors 415 and 425, and the difference between the resistances of resistors 420 and 430, provide the current difference Ib.

To provide the current difference Ir, voltage supply 435 is included in preamplifier 1000. The positive terminal of voltage supply 435 is connected to that end of resistor 430 which is not connected to the emitter terminal of transistor 425.

Biasing circuit 700 and current source 900 of preamplifier 1000 allow the base-emitter voltages of transistors 415 and 425 to remain substantially the same, in spite of the difference in the magnitudes of currents I480 and I400.

One advantage of preamplifier 1000 is that as the magnitude of the current required by the MR head varies, the currents that flow through load resistors 130 and 135 remain unchanged.

Another advantage of preamplifier 1000 is that it operates as an open-loop system and, thus, many difficulties that must be overcome while designing a closed-loop system are not present in preamplifier 1000.

The use of p-channel MOS and npn bipolar transistors in the present invention is solely for the purpose of illustrating exemplary embodiments of the invention. A preamplifier, in accordance with the present invention, could also be formed from n-channel MOS and pnp bipolar transistors and is considered within the scope of this invention. Further modifications will be apparent to one skilled in the art and are intended to fall within the scope of the appended claims.

I claim:

1. A differential amplifier comprising:
   a pair of amplifiers each comprising a plurality of transistors;
   a pair of input terminals;
   a pair of output terminals for providing differential output voltage signals; and
   a by-pass circuitry coupled to said amplifier such that the DC currents flowing through each of first and second branches of said by-pass circuitry are substantially equal in magnitude and wherein the DC current flowing through the first branch of the by-pass circuitry flows through a transistor of the first amplifier and wherein the DC current flowing through the second branch of the by-pass circuitry flows through a transistor of the second amplifier.

2. A differential amplifier according to claim 1 further comprising a feedback circuit for sensing the differential output voltage signals and generating a voltage signal proportional thereto and for applying the generated voltage signal to the amplifier.

3. A differential amplifier according to claim 1 wherein said differential amplifier is a common-emitter-common-base cascode read amplifier.

4. A differential common-emitter-common-base cascode read preamplifier according to claim 3, wherein said by-pass circuitry includes a diode-connected bipolar transistor and a pair of resistors, wherein the base and the collector terminals of the transistor are connected to a DC voltage supply and the emitter terminal of the transistor is connected to a first end of each of said resistors, wherein a second end of each of said resistors is connected to a different one of the common-emitter-common-base amplifiers.

5. A differential amplifier according to claim 3, wherein said by-pass circuitry includes p-channel MOS transistors, wherein the drain terminals of the p-channel MOS transistors are connected to a different one of the common-emitter-common-base amplifiers and the source terminals of said p-channel MOS transistors are connected to a DC voltage supply.

6. A differential common-emitter-common-base cascode read preamplifier according to claim 4, wherein the base terminal of a common-base transistor of each common-emitter-common-base amplifier is connected to a DC voltage supply.

7. A differential common-emitter-common-base cascode read preamplifier according to claim 6, wherein said feedback circuit comprises an amplifier.

8. A differential common-emitter-common-base cascode read preamplifier according to claim 7 further comprising a filtering circuit for eliminating the AC voltage signal components from the voltage signals applied to the input terminals of said feedback amplifier.

9. A differential common-emitter-common-base cascode read preamplifier according to claim 8, wherein said filtering circuit comprises resistors and capacitors.

10. A differential common-emitter-common-base cascode read preamplifier according to claim 9 further comprising a capacitor for coupling the voltages at the base terminals of common-emitter transistors of each of the common-base-common-emitter amplifiers.

11. A differential common-emitter-common-base cascode read preamplifier according to claim 10 further comprising a DC current source for biasing thereof.

12. A method of amplifying signals comprising:

forming a pair of amplifiers each comprising a plurality of transistors; and coupling a by-pass circuitry to said pair of amplifiers such that the DC currents flowing through first and second branches of said by-pass circuitry are equal in magnitude and wherein the DC current flowing through the first branch of the by-pass circuitry flows through a transistor of the first amplifier and wherein the DC current flowing through the second branch of the by-pass circuitry flows through a transistor of the second amplifier.

13. A differential amplifier according to claim 5 further comprising a DC current source for biasing thereof.

14. A differential common-emitter-common-base cascode read amplifier comprising:

a pair of amplifiers each comprising a plurality of transistors;

a pair of input terminals;

a pair of output terminals for providing differential output voltage signals;

a by-pass circuitry coupled to said preamplifier such that the DC currents flowing through first and second branches of said by-pass circuitry are substantially equal in magnitude and wherein the DC current flowing through each of the first branch of the by-pass circuitry flows through a transistor of the first amplifier and wherein the DC current flowing through the second branch of the by-pass circuitry flows through a transistor of the second amplifier; wherein said by-pass circuitry includes p-channel MOS transistors, wherein the drain terminals of the p-channel MOS transistors are connected to a different one of the common-emitter-common-base amplifiers and the source terminals of said p-channel MOS transistors are connected to a DC voltage supply;

a DC current source for biasing the differential common-emitter-common-base cascode read amplifier; and a current source for biasing the by-pass circuitry, said P-channel MOS transistors in said by-pass circuitry being connected to said current source such that each of said P-channel MOS transistors produces a current that substantially mirrors the current flowing through said current source.

15. A differential common-emitter-common-base cascode read amplifier according to claim 14, wherein the DC current source for biasing the cascode read amplifier includes a DC voltage supply, a resistor and a bipolar transistor, wherein the positive terminal of the voltage supply is applied to the base terminal of the bipolar transistor and one end of said resistor is connected to the emitter terminal of the bipolar transistor.

16. A differential common-emitter-common-base cascode read amplifier according to claim 15, wherein the current source for biasing the by-pass circuit includes a P-channel MOS transistor, a bipolar transistor, a resistor and a DC voltage supply, wherein the gate and the drain terminals of the P-channel MOS transistor is connected to the collector terminal of the bipolar transistor and to the gate terminals of P-channel MOS transistors of said by-pass circuit, wherein the base terminal of the bipolar transistor is connected to the base terminal of the bipolar transistor of said DC current source used for biasing the cascode amplifier, wherein the emitter terminal of the bipolar transistor is connected to a first end of the resistor, and the positive terminal of the voltage supply is connected to a second end of the resistor.

17. A differential common-emitter-common-base cascode read amplifier according to claim 16, wherein said differential common-emitter-common-base cascode read amplifier has a high gain.

18. A differential common-emitter-common-base cascode read amplifier according to claim 16, wherein said differential common-emitter-common-base cascode read amplifier has a high bandwidth.

19. A differential common-emitter-common-base cascode read amplifier according to claim 16, wherein said differential common-emitter-common-base cascode read amplifier has low noise.

20. A differential common-emitter-common-base cascode read preamplifier according to claim 11, wherein said preamplifier has a high gain.

21. A differential common-emitter-common-base cascode read preamplifier according to claim 11, wherein said preamplifier has a high bandwidth.

22. A differential common-emitter-common-base cascode read preamplifier according to claim 11, wherein said preamplifier has low noise.

23. The method of claim 12 further comprising forming a feedback circuit for sensing differential output voltage signals generated by the pair of amplifiers and for generating a voltage signal proportional thereto and applying the generated signal to the amplifier.

24. The method of claim 23 wherein the act of forming a pair of amplifiers each comprising at least two transistors includes the act of forming a pair of common-emitter-common-base cascode read amplifiers.

* * * * *